United States Patent
Stum et al.

(10) Patent No.: US 9,006,027 B2
(45) Date of Patent: Apr. 14, 2015

(54) SYSTEMS AND METHODS FOR TERMINATING JUNCTIONS IN WIDE BANDGAP SEMICONDUCTOR DEVICES

(75) Inventors: Zachary Matthew Stum, Niskayuna, NY (US); Ahmed Elasser, Latham, NY (US); Stephen Daley Arthur, Schenectady, NY (US); Stanislav I. Soloviev, Ballston Lake, NY (US); Peter Almern Losee, Starkville, MS (US)

(73) Assignee: General Electric Company, Niskayuna, NY (US)

( * ) Notice: Subject to any disclaimer, the term of this patent is extended or adjusted under 35 U.S.C. 154(b) by 110 days.

(21) Appl. No.: 13/610,614

(22) Filed: Sep. 11, 2012

(65) Prior Publication Data

US 2014/0070229 A1    Mar. 13, 2014

(51) Int. Cl.
| | |
|---|---|
| H01L 21/00 | (2006.01) |
| H01L 31/0328 | (2006.01) |
| H01L 29/06 | (2006.01) |
| H01L 29/74 | (2006.01) |
| H01L 29/87 | (2006.01) |
| H01L 21/02 | (2006.01) |
| H01L 29/73 | (2006.01) |
| H01L 29/739 | (2006.01) |
| H01L 29/16 | (2006.01) |
| H01L 29/20 | (2006.01) |

(52) U.S. Cl.
CPC ............ *H01L 29/0661* (2013.01); *H01L 29/73* (2013.01); *H01L 29/7395* (2013.01); *H01L 29/74* (2013.01); *H01L 29/87* (2013.01); *H01L 29/063* (2013.01); *H01L 29/1608* (2013.01); *H01L 29/2003* (2013.01); *H01L 21/02107* (2013.01)

(58) Field of Classification Search
CPC ............ H01L 29/1602; H01L 29/7802; H01L 29/6606
USPC .................. 257/76–77, 94, 98–100, 330, 327; 438/105, 931, 24, 22, 29, 46, 47, 956
See application file for complete search history.

(56) References Cited

U.S. PATENT DOCUMENTS

| | | |
|---|---|---|
| 4,904,609 A | 2/1990 | Temple |
| 4,999,684 A | 3/1991 | Temple |
| 5,041,896 A | 8/1991 | Temple et al. |
| 6,573,534 B1 | 6/2003 | Kumar et al. |
| 7,989,882 B2 | 8/2011 | Zhang et al. |
| 8,129,245 B2 | 3/2012 | Yedinak et al. |

(Continued)

OTHER PUBLICATIONS

Mihaila et al., "Evaluation of Termination Techniques for 4h-SiC Pin Diodes and Trench JFETS", Materials Science Forum, vol. 556-557, pp. 925-928, Sep. 2007.

*Primary Examiner* — Hoa B Trinh
(74) *Attorney, Agent, or Firm* — Scott J. Asmus

(57) ABSTRACT

An electrical device includes a blocking layer disposed on top of a substrate layer, wherein the blocking layer and the substrate layer each are wide bandgap semiconductors, and the blocking layer and the substrate layer form a buried junction in the electrical device. The device comprises a termination feature disposed at a surface of the blocking layer and a filled trench disposed proximate to the termination feature. The filled trench extends through the blocking layer to reach the substrate layer and is configured to direct an electrical potential associated with the buried junction toward the termination feature disposed near the surface of the blocking layer to terminate the buried junction.

30 Claims, 11 Drawing Sheets

(56) References Cited

U.S. PATENT DOCUMENTS

| 8,431,991 | B2* | 4/2013 | Iwamuro | 257/341 |
| 2007/0012983 | A1 | 1/2007 | Yang et al. | |
| 2008/0251793 | A1 | 10/2008 | Mazzola et al. | |
| 2009/0289262 | A1 | 11/2009 | Zhang et al. | |
| 2010/0320476 | A1 | 12/2010 | Cheng et al. | |
| 2011/0272735 | A1 | 11/2011 | Schmidt | |

* cited by examiner

SYSTEMS AND METHODS FOR TERMINATING JUNCTIONS IN WIDE BANDGAP SEMICONDUCTOR DEVICES

BACKGROUND

The subject matter disclosed herein relates to semiconductor devices and, more specifically, to electrical termination of devices utilizing wide bandgap semiconductors (e.g., silicon carbide (SiC) or gallium nitride (GaN)).

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Power electronics systems are widely used throughout modern electrical systems to convert electrical power from one form to another form for consumption by a load. Many power electronics systems utilize various semiconductor devices and components, such as thyristors, diodes, and various types of transistors (e.g., metal-oxide-semiconductor field-effect transistor (MOSFETs), junction gate field-effect transistor (JFETs), insulated gate bipolar transistors (IGBTs), and other suitable transistors), in this power conversion process. Specifically for high-voltage and/or high-current applications, devices utilizing wide bandgap semiconductors (e.g., silicon carbide (SiC) and gallium nitride (GaN) devices) have a number of advantages in terms of temperature stability, reduced ON-resistance, and thinner device dimensions than corresponding silicon (Si) devices. Accordingly, wide bandgap semiconductor devices offer advantages to electrical conversion applications including, for example, power distribution systems (e.g., in electrical grids), power generation systems (e.g., in solar and wind converters), as well as consumer goods (e.g., electric vehicles, appliances, power supplies, etc.). However, the differences between SiC/GaN and Si devices, for example, can cause certain solutions (e.g., device designs and/or manufacturing processes) that work well for Si devices to be unsuitable for corresponding wide-bandgap semiconductor devices. Accordingly, in addition to their benefits, wide-bandgap semiconductor devices also present challenges during device design and fabrication.

BRIEF DESCRIPTION

In one embodiment, an electrical device includes a blocking layer disposed on top of a substrate layer, wherein the blocking layer and the substrate layer each are wide bandgap semiconductor layers and the blocking layer and the substrate layer form a buried junction in the electrical device. The device comprises a termination feature disposed at a surface of the blocking layer and a filled trench disposed proximate to the termination feature. The filled trench extends through the blocking layer to reach the substrate layer and is configured to direct an electrical potential associated with the buried junction toward the termination feature disposed near the surface of the blocking layer to terminate the buried junction.

In another embodiment, a wide bandgap semiconductor device includes a substrate layer of a first dopant-type and a blocking layer of a second dopant-type, wherein the blocking layer is disposed on the substrate layer to form a buried junction, and wherein the blocking layer comprises a filled trench and a termination feature that are configured to cooperate to terminate the buried junction, and wherein the termination feature comprises a junction termination extension (JTE), a field stop, or a combination thereof.

In another embodiment, a method for terminating a buried junction of a wide bandgap semiconductor device includes providing the wide bandgap semiconductor device having a blocking layer disposed on an underlying substrate layer, wherein the blocking layer and the underlying substrate layer form a buried junction in the device. The method includes forming a field stop, a junction termination extension (JTE), or both, near a surface of the blocking layer. The method also includes etching a trench through the blocking layer of the wide bandgap semiconductor device to reach the underlying substrate layer. The trench is configured to direct an electrical potential associated with the buried junction toward the surface of the blocking layer, and the field stop, the JTE, or both, are configured to terminate the buried junction by substantially reducing the electrical potential associated with the buried junction.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
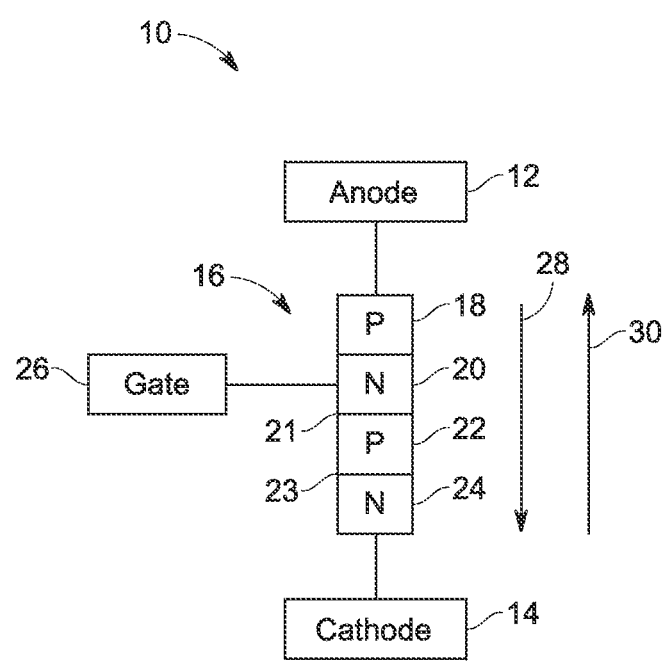
FIG. 1 is a schematic of a SiC device, in accordance with an embodiment of the present approach.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

As mentioned, the physical differences between wide-bandgap semiconductors (e.g., SiC, GaN, aluminum nitride (AlN), boron nitride (BN), etc.) and Si can cause certain device designs and/or manufacturing processes that are suitable for Si-based devices to be unsuitable for corresponding wide-bandgap semiconductor devices. For example, it may be desirable to electrically terminate a semiconductor device such that the relatively strong electric fields generated within the device (e.g., at junctions in the device) are not propagated to other devices or components outside of the device. By specific example, a Si semiconductor device may have a blocking layer and a substrate layer that form a buried p-n junction for reverse blocking for use in electrical power applications (e.g., AC switching applications). In contrast, the electrical transport properties of SiC are such that a comparable SiC semiconductor device (e.g., capable of performing substantially the same function as the aforementioned Si device) may have a substantially thinner blocking layer and a substantially thicker substrate layer than the corresponding Si device. Accordingly, while the Si semiconductor device may afford the option of electrically terminating the buried junction from both the front and the back side of the Si device, the SiC device may instead utilize other methods of electrically terminating buried junctions.

As such, present embodiments are directed toward systems and methods for electrically terminating buried junctions in wide bandgap semiconductor devices (e.g., SiC and/or GaN devices). In particular, certain embodiments involve etching a trench through a blocking layer of a wide bandgap semiconductor device to reach an underlying substrate. Subsequently, the present approach affords a number of different embodiments that utilize this etched trench in different ways to electrically terminate the wide bandgap semiconductor device. Generally speaking, present wide bandgap semiconductor device embodiments terminate the buried junction by directing the electrical potential induced by the buried junction to the surface of a blocking layer, where one or more termination features (e.g., junction termination extensions (JTEs), field stops, field rings, guard rings, long bevels, or other suitable features) significantly reduce the strength of the electrical potential, effectively terminating the buried junction of the wide-bandgap semiconductor device. It should be appreciated that, while the present discussion may be focused on a particular wide bandgap semiconductor device (e.g., a SiC thyristor), the presently disclosed techniques may be applicable to any wide bandgap semiconductor (e.g., SiC, GaN, and/or other suitable wide bandgap semiconductor) device concerned with electrical termination, such as IGBTs, bipolar junction transistors (BJTs), a gate turned-off thyristor (GTO), or other suitable power devices having at least one junction to be terminated.

With the foregoing in mind, FIG. 1 illustrates a schematic of a SiC device 10 (e.g., thyristor 10), in accordance with an embodiment of the present approach. That is, the SiC device 10 illustrated in FIG. 1 may implement one of the processes set forth below (e.g., with respect to FIGS. 2, 4, 5, 6, and 10) to electrically terminate a buried junction of the SiC device 10. The illustrated SiC device 10 may be a SiC semiconductor device, such as a thyristor, that may be used in the conversion of electrical power (e.g., AC switching applications). As such, the illustrated SiC device 10 includes an anode 12 and the cathode 14 disposed on opposite sides of a stack of semiconducting layers 16. The individual layers in the illustrated stack 16 of semiconducting layers include a positively doped or p-doped layer 18 (e.g., doped using boron or another positive dopant), a negatively doped or n-doped layer 20 (e.g., doped using phosphorus or another negative dopant), a p-doped blocking layer 22, and an n-doped substrate layer 24. It should be appreciated that, in other embodiments, the stack of semiconducting layers 16 of the SiC device 10 may be alternatively organized (e.g, first n-doped, then p-doped, then n-doped, then p-doped).

Furthermore, the SiC device 10 illustrated in FIG. 1 includes at least two junctions (e.g., p-n junctions): a junction 21 between the n-doped layer 20 and the p-doped blocking layer 22, and a second junction 23 between the p-doped blocking layer 22 and the n-doped substrate layer 24. Accordingly, as set forth in detail below, the embodiments of the SiC device 10 presently disclosed include a number of features to aid in electrically terminating the junctions 21 and 23. Further, there may be electrical fields associated with the junctions 21 and 23 of the SiC device 10. Accordingly, it may be desirable to electrically terminate the SiC device 10 (e.g., the junctions 21 and 23 of the SiC device 10) such that the electrical potential associated with these junctions may be confined to the SiC device 10, rather than extend into, and possibly affecting the operation of, other nearby devices or components.

The SiC device 10 illustrated in FIG. 1 also includes a gate 26 that is electrically coupled to one of the layers (e.g., n-doped layer 20) of the illustrated stack of semiconducting layers 16. During operation, the SiC device 10 (e.g., thyristor 10) illustrated in FIG. 1 may allow a current to flow from the anode 12 to the cathode 14 (e.g., in direction 28) when an appropriate bias is applied to the gate 26. In the absence of a gate bias, the SiC device 10 may symmetrically block the flow of current between the anode 12 and the cathode 14 in direction 28 as well as the reverse flow of current between the cathode 14 and the anode 12 in direction 30. However, when a suitable bias is applied to the gate 26, a depletion zone (or alternatively an accumulation region) may be formed such that the stack of semiconducting layers 16 becomes conductive, allowing current to flow from the anode 12 to the cathode 14 (e.g., in direction 28).

With the foregoing in mind, as set forth below, FIGS. 2, 4, 6, 8, and 10 disclose embodiments of different processes by which a particular SiC device (e.g., the SiC device 10) may be electrically terminated. Furthermore, FIGS. 3, 5, 7, 9, and 11 respectively illustrate examples of SiC devices (e.g., thyristors 60, 90, 110, 130 and 150) that have been electrically terminated using the processes set forth in FIGS. 2, 4, 6, 8, and 10. It should be appreciated that the processes set forth in FIGS. 2, 4, 6, 8, and 10 are intended to illustrate steps involved in terminating the buried junction that may be performed during the manufacture of the SiC devices. As such, it should be noted that other SiC manufacturing steps (e.g., annealing, coating, sealing, packaging, and so forth) may also be performed when manufacturing the SiC devices, such as may be understood by one of ordinary skill in the art. Furthermore, it should be appreciated that the elements of the SiC devices illustrated in FIGS. 3, 5, 7, 9, and 11 are not drawn to scale, but rather are intended to illustrate the relative positioning of the elements (e.g., layers) within the SiC devices 10.

Figure 2:
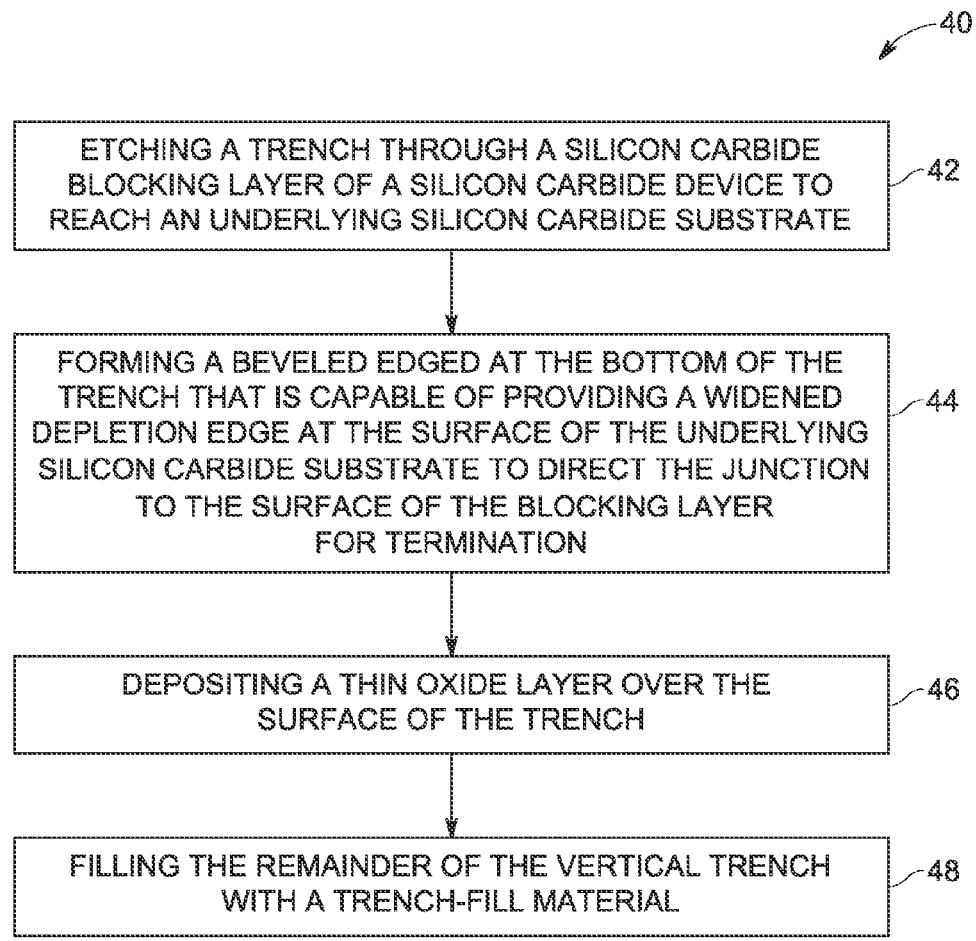
FIG. 2 is a flow diagram illustrating a first process by which the SiC device of FIG. 1 may be terminated, in accordance with an embodiment of the present approach.

FIG. 2 illustrates a first process 40 for electrically terminating a buried junction in a SiC device 10, in accordance with an embodiment of the present approach. As set forth above, the process 40 illustrated in FIG. 2 may be more clearly understood in the context of the thyristor 60 illustrated in FIG. 3 and discussed in detail below. With this in mind, the process 40 illustrated in FIG. 2 begins with etching (block 42) a trench through a portion of a SiC blocking layer (e.g., blocking layer 22) of a SiC semiconductor device to reach an underlying SiC substrate layer (e.g., substrate layer 24). In certain embodiments, this etching may be accomplished using standard wet or dry etching techniques. Further, in certain embodiments, the trench may have substantially vertical sidewalls, while, in other embodiments, the sidewalls of the trench may not be perpendicular to the base of the trench. Additionally, in certain embodiments, the trench may be disposed proximate to (e.g., near, within approximately 10 µm or less, within approximately 1 µm or less) certain features of the blocking layer 22 (e.g., junction termination extensions (JTEs) and/or field stops, discussed below) that may also be involved in the termination process. It should be appreciated that, as set forth below, the various processes presently disclosed for terminating buried junctions in SiC devices may generally involve this initial etching step. However, as set forth below, the shape of the trench resulting from the etching, and/or how the trench is subsequently utilized, may be different for various embodiments.

Next in the process 40 illustrated in FIG. 2, beveled edges may be formed (block 44) at the bottom of the trench. In certain embodiments, the beveled edges may be formed using standard SiC manufacturing techniques (e.g., standard lithography, deposition, and etching techniques). Once the beveled edges have been formed, a thin oxide layer (e.g., silicon oxide layer) may be deposited (block 46) onto the surface of the trench. In certain embodiments, the thin insulating layer 66 may be deposited using chemical vapor deposition (CVD) or formed by oxidizing a thin portion of the surfaces of the etched trench. Lastly, the remainder of the trench 62 may be filled (block 48) with a trench-fill material (e.g., polysilicon (poly-Si), silicon oxide, silicon nitride, or any other suitable non-conductive trench-fill material). In certain embodiments, the trench-fill material may be deposited using CVD or other suitable deposition technique.

Figure 3:
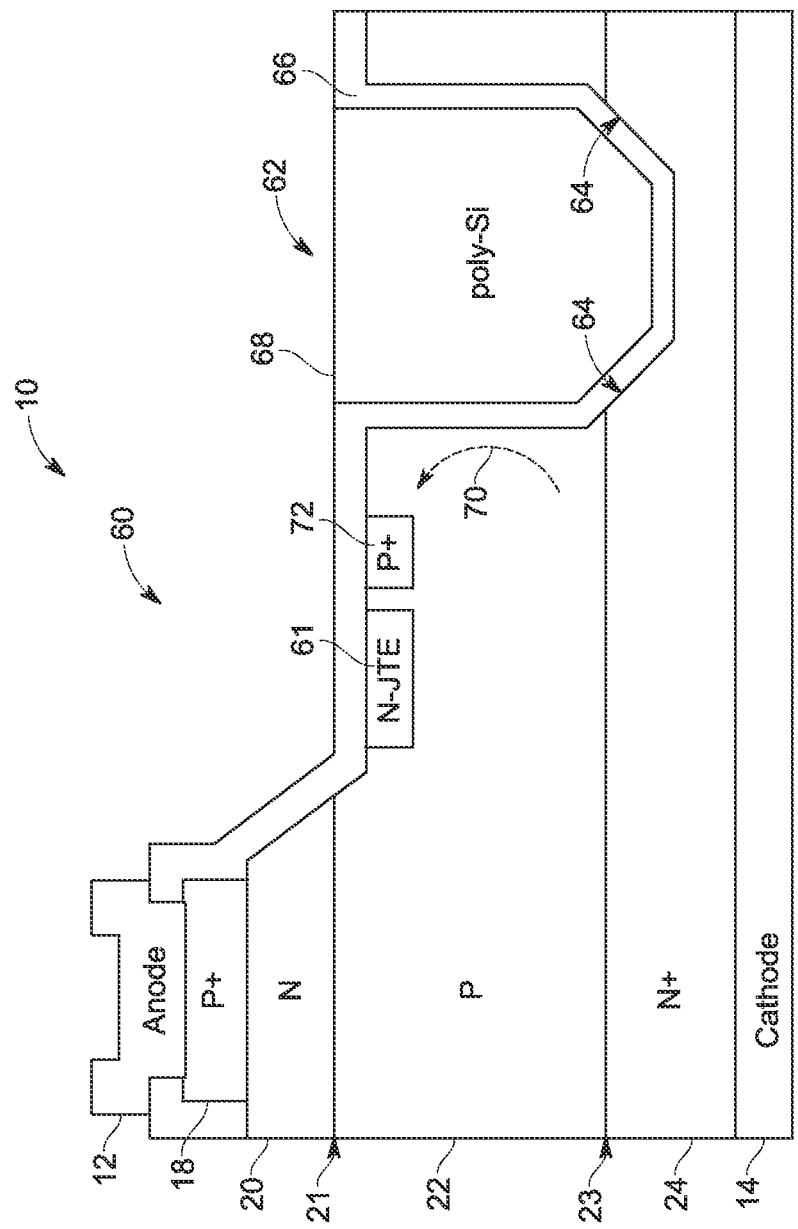
FIG. 3 is a schematic of an embodiment of a first thyristor that has been terminated according to the process of FIG. 2.

FIG. 3 illustrates an example of the SiC semiconductor device 10, namely thyristor 60, that having a buried junction that is terminated according to the process 40 illustrated in FIG. 2. Like the SiC device 10 illustrated in FIG. 1, the thyristor 60 includes an anode 12 and the cathode 14 separated by a number of semiconducting layers (e.g., layers 18, 20, 22, and 24). In certain embodiments, the SiC substrate 24 layer may be a single crystal n-doped or p-doped SiC substrate. In certain embodiments, the SiC substrate 24 may have a thickness between approximately 50 µm to approximately 500 µm, or even up to 1 mm. Furthermore, there is a blocking layer 22 that is disposed on the illustrated SiC substrate 24 layer. In certain embodiments, the blocking layer 22 may be epitaxially grown SiC that, in certain embodiments, may be n-doped or p-doped (e.g., opposite the doping of the underlying substrate 24). Further, in certain embodiments, the blocking layer 22 may have a thickness between approximately 1 µm and approximately 50 µm.

Additionally, it should be appreciated that the illustrated thyristor 60 includes at least two p-n junctions (e.g., junctions 21 and 23) to be electrically terminated. The first junction 21 (e.g., between the n-doped layer 20 and the p-doped blocking layer 22) may be terminated using the illustrated n-doped junction termination extension (JTE), N-JTE 61 disposed near (e.g., at, proximate to, less than 10 µm away from, or less than 1 µm away from) the surface of the blocking layer 22. That is, the N-JTE 61 may be oppositely doped relative to the blocking layer 22 such that the strength of the electrical potential associated with the junction may be reduced as it traverses the N-JTE 61, effectively terminating the first p-n junction 21. It should further be appreciated that the second p-n junction 23 (e.g., between the p-doped blocking layer 22 and the n-doped substrate layer 24) represent a relatively deeply buried junction 21 that may be electrically terminated in various ways, as set forth below.

For example, the thyristor 60 illustrated in FIG. 3 has a portion of the blocking layer 22 that has been removed to create a trench 62 (e.g., in block 42 of FIG. 2). More specifically, the trench 62 illustrated in FIG. 3 includes beveled edges 64 at the bottom that have been etched into the blocking layer 22 and extend into a portion of the underlying substrate 24 (e.g., from block 44 of FIG. 2). Further, a thin insulating layer 66 (e.g., from block 46 of FIG. 2), such as silicon oxide, and a polysilicon (poly-Si) trench-fill material 68 (e.g., in block 48 of FIG. 2) are disposed in the etched trench 62. In certain embodiments, the thin insulating layer 66 may have a thickness between approximately 10 nm and approximately 100 µm.

During operation, the beveled edges 64 illustrated for the thyristor 60 of FIG. 3 are capable of providing a widened depletion edge at the surface of the underlying SiC substrate 24. That is, the beveled edges 64 of the etched trench 62 may generally provide a widened depletion edge generally directing the junction 23 (e.g., the electrical potential 70 induced by the junction 23) toward the surface of the blocking layer 22. Furthermore, upon reaching the field stop 72, the strength of the junction (e.g., the electrical potential 70 induced by the junction 23) may be significantly reduced, effectively terminating the buried junction 23 of the thyristor 60.

Figure 4:
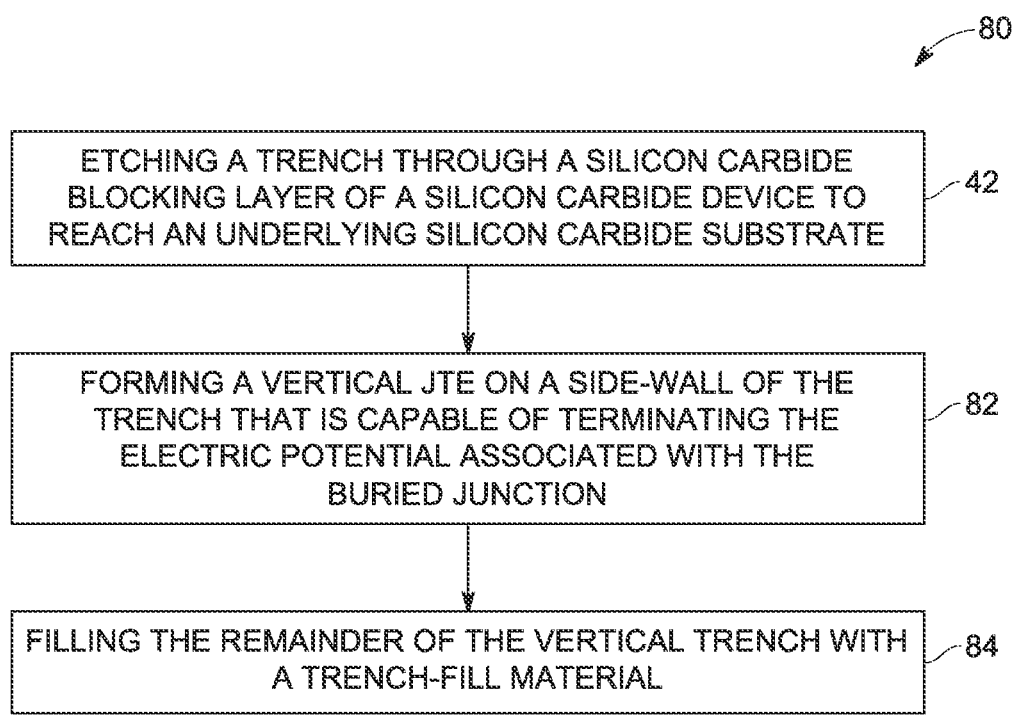
FIG. 4 is a flow diagram illustrating a second process by which the SiC device of FIG. 1 may be terminated, in accordance with an embodiment of the present approach.

FIG. 4 illustrates a second process 80 for terminating a buried junction of a SiC device 10, in accordance with an embodiment of the present approach. As set forth above, the process 80 illustrated in FIG. 4 may be more clearly understood in the context of the thyristor 90 illustrated in FIG. 5 and discussed in detail below. Like the process 40 illustrated in FIG. 2, the process 80 illustrated in FIG. 4 begins with etching (block 42) a trench through a portion of a SiC blocking layer (e.g., blocking layer 22) of a SiC semiconductor device 10 to reach an underlying SiC substrate layer (e.g., substrate layer 24). Next, a vertical JTE may be formed (block 82) on a wall of the vertical trench, in which the vertical JTE is capable of terminating the electrical potential associated with the buried junction. In certain embodiments, the vertical JTE may be formed using standard SiC manufacturing techniques (e.g., standard lithography, deposition, and etching techniques). Once the vertical JTE has been formed, the remainder of the trench 62 may be filled (block 84) with a trench-fill material (e.g., polysilicon (poly-Si), silicon oxide, or any other suitable trench-fill material).

Figure 5:
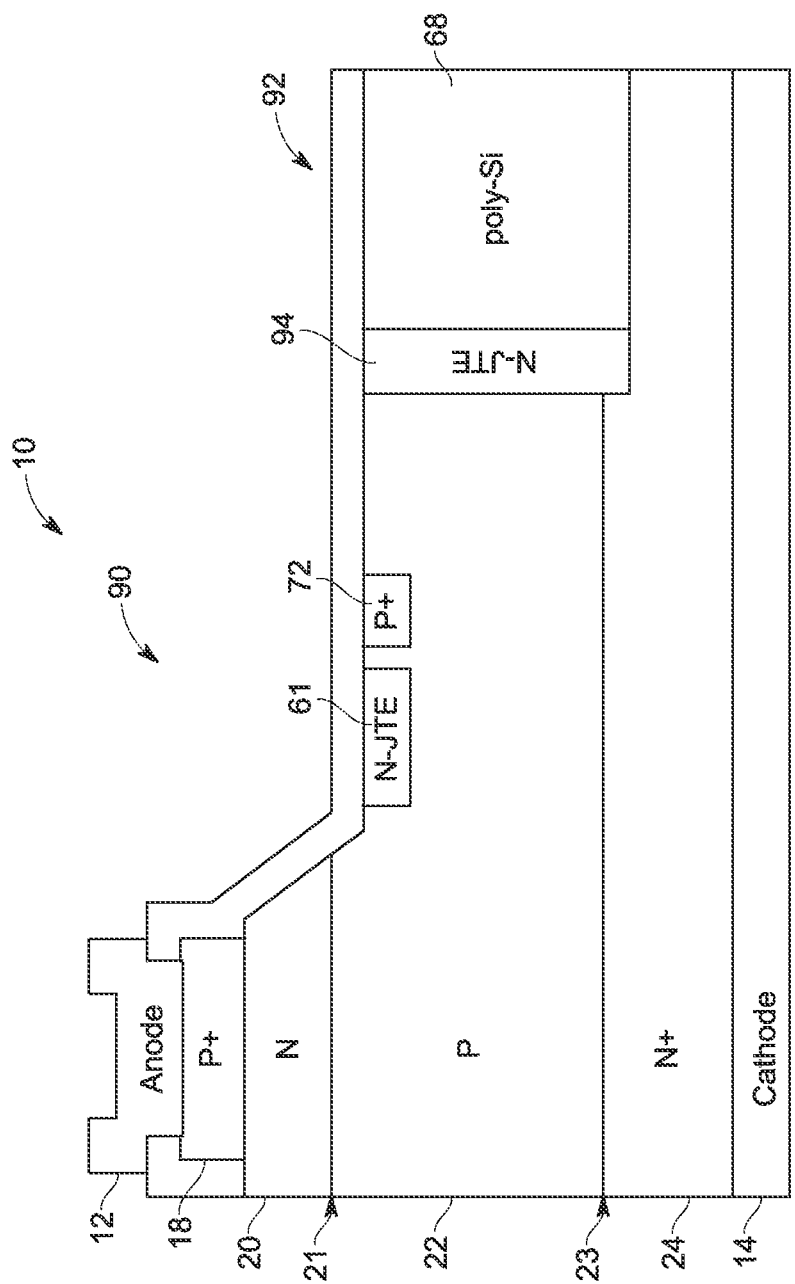
FIG. 5 is a schematic of an embodiment of a second thyristor that has been terminated according to the process of FIG. 4.

For example, the thyristor 90 illustrated in FIG. 5 includes many of the features set forth above, with respect to thyristor 60 of FIG. 3. That is, the thyristor 90 illustrated in FIG. 5 has a portion of the blocking layer 22 that has been removed to create a trench 92 having substantially vertical side-walls (e.g., in block 42 of FIG. 4). More specifically, the trench 92 illustrated in FIG. 5 includes a vertical JTE (e.g., N-JTE 94) disposed in a sidewall of the trench 92 (e.g., in block 82 of FIG. 4). Further, a polysilicon (poly-Si) fill layer 68 is disposed in the etched trench 62 (e.g., from block 84 of FIG. 4). During operation, the vertical N-JTE 94 and the field stop 72 of the thyristor 90 illustrated in FIG. 5 may cooperate to electrically terminate the buried junction 23 (e.g., the electrical potential 70 induced by the junction 23) of the thyristor 90. That is, the vertical N-JTE-94 disposed in the sidewall of the etched trench 92 may generally terminate the junction 23, reducing the electrical potential near the surface of the blocking layer 22.

Figure 6:
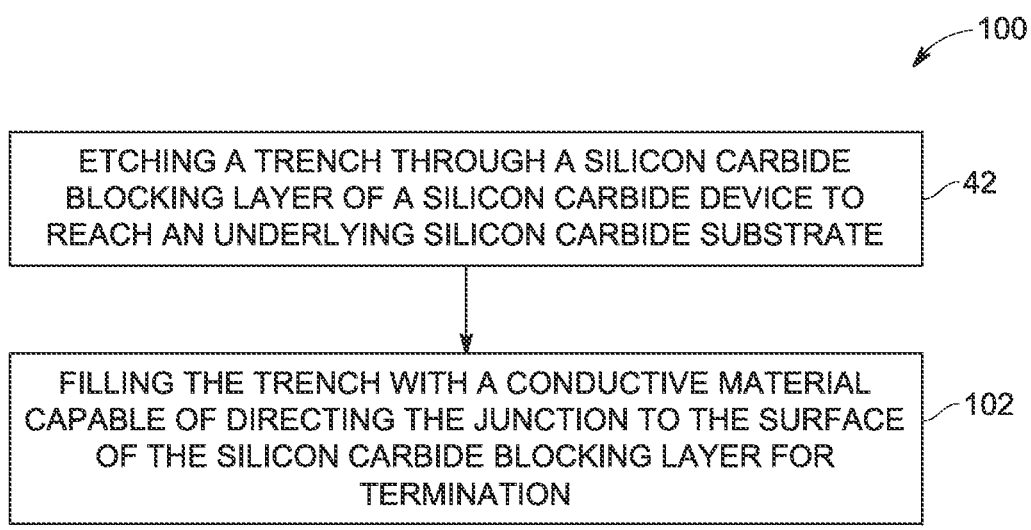
FIG. 6 is a flow diagram illustrating a third process by which the SiC device of FIG. 1 may be terminated, in accordance with an embodiment of the present approach.

FIG. 6 illustrates a third process 100 for terminating a buried junction of a SiC device 10, in accordance with an embodiment of the present approach. As set forth above, the process 100 illustrated in FIG. 6 may be more clearly understood in the context of the thyristor 110 illustrated in FIG. 7 and discussed in detail below. Like the processes 40 and 80 discussed above, the process 100 illustrated in FIG. 6 begins with etching (block 42) a trench through a portion of a SiC blocking layer (e.g., blocking layer 22) of a SiC semiconductor device 10 to reach an underlying SiC substrate layer (e.g., substrate layer 24). Subsequently, the trench may be filled (block 102) with a conductive material, such as doped SiC (e.g., n+ SiC) or doped poly-Si (e.g., n+ poly-Si). This conductive material may be deposited into the vertical trench using standard SiC and/or Si manufacturing techniques (e.g., lithography, deposition, and/or etching techniques). Further, as set forth below, the conductive material deposited in block 102 may function in combination with a JTE and/or field stop to electrically terminate the buried junction 23 of the SiC device 10.

Figure 7:
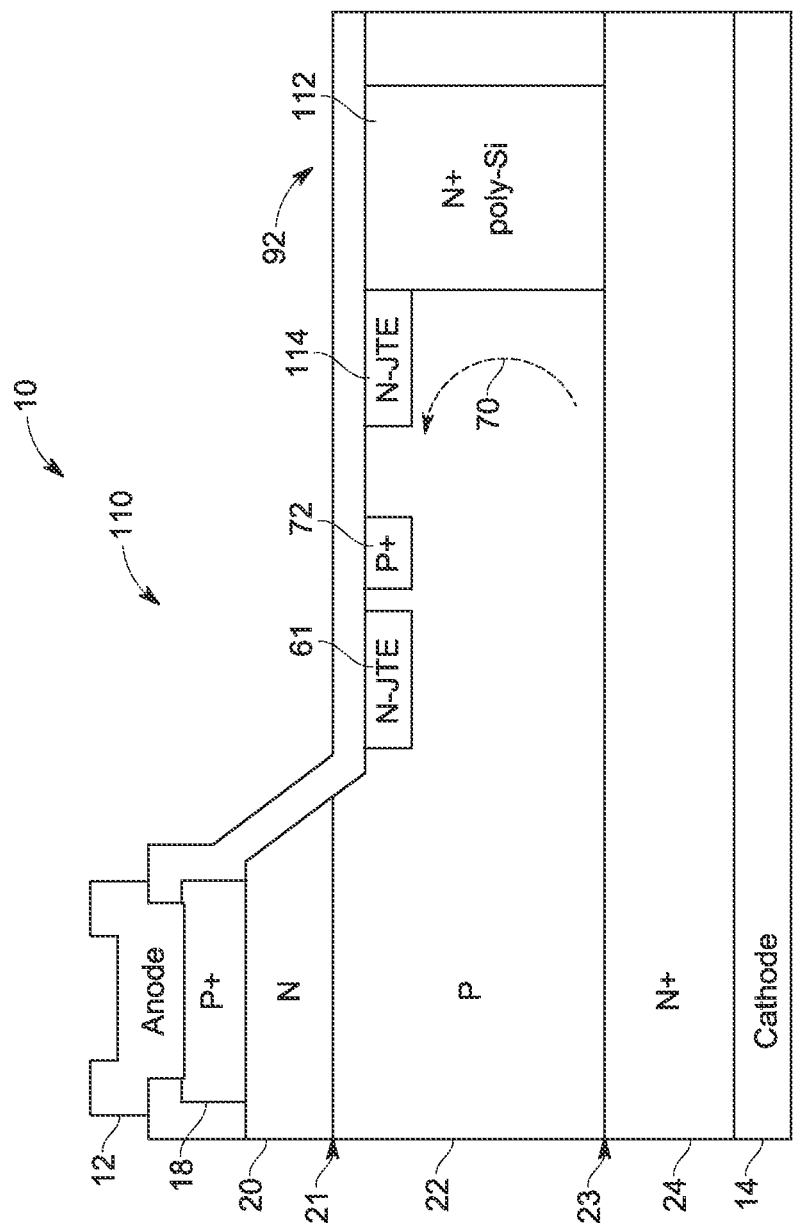
FIG. 7 is a schematic of an embodiment of a third thyristor that has been terminated according to the process of FIG. 6.

Accordingly, the thyristor 110 illustrated in FIG. 7 includes many of the features set forth above, with respect to thyristors 60 and 90 of FIGS. 3 and 5, respectively. For example, the thyristor 110 illustrated in FIG. 7 has a portion of the blocking layer 22 that has been removed to create a trench 92 (e.g., in block 42 of FIG. 6). In contrast to the other thyristors, the trench 92 of the thyristor 110 illustrated in FIG. 7 includes an n-doped SiC layer 112 disposed in the trench 92 (e.g., from block 102 of FIG. 6) as a conductive material. During operation, the n-doped SiC layer 112, the N-JTE 114, and the field stop 72 may cooperate to electrically terminate the buried junction 23 (e.g., the electrical potential 70 induced by the junction 23) of the thyristor 110. That is, the n-doped SiC layer 112 disposed in the etched trench 92 may generally direct the junction (e.g., the electrical potential 70 induced by the junction 23) toward the surface of the blocking layer 22. Furthermore, upon reaching the N-JTE 114 and/or field stop 72, the strength of the junction (e.g., the electrical potential 70 induced by the junction 23) may be significantly reduced, effectively terminating the junction 23 of the thyristor 110.

Figure 8:
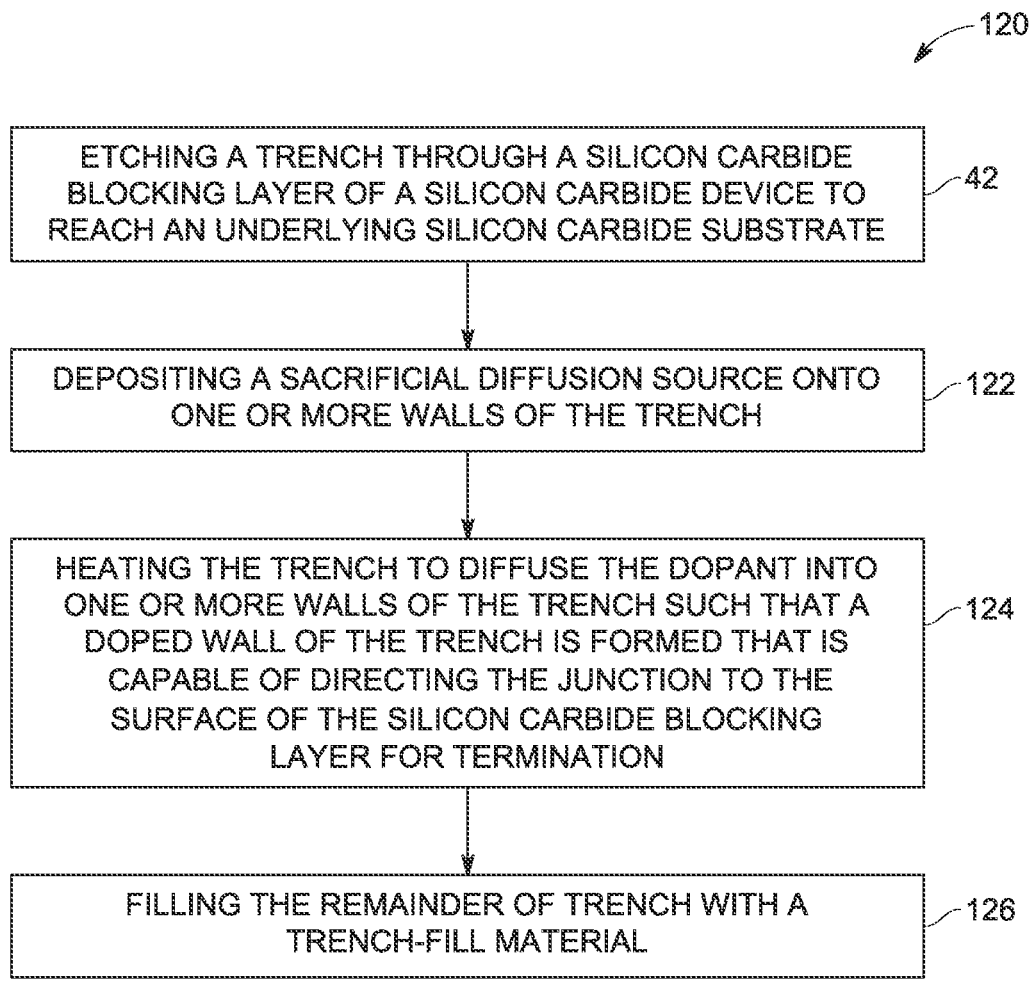
FIG. 8 is a flow diagram illustrating a fourth process by which the SiC device of FIG. 1 may be terminated, in accordance with an embodiment of the present approach.

FIG. 8 illustrates a fourth process 120 for terminating a buried junction of the SiC device 10, in accordance with an embodiment of the present approach. As set forth above, the process 120 illustrated in FIG. 8 may be more clearly understood in the context of the thyristor 130 illustrated in FIG. 9 and discussed in detail below. Like the processes 40, 80, and 100 previously discussed, the process 120 begins with etching (block 42) a trench through a portion of a SiC blocking layer (e.g., blocking layer 22) of a SiC semiconductor device 10 to reach an underlying SiC substrate layer (e.g., substrate layer 24). Subsequently, a sacrificial diffusion source (e.g., a doping source such as phosphorus pentoxide) may be deposited (block 122) onto the surface of one or more walls of the trench. This sacrificial diffusion source may be deposited into the trench using standard SiC manufacturing techniques (e.g., lithography, CVD, and/or etching techniques).

Next in the process 120 illustrated in FIG. 8, the vertical trench of the SiC device 10, or the entire SiC device 10, may be heated (block 124) to diffuse the dopant into one or more walls of the trench. The final step in the illustrated process 120 is filling (block 126) the remainder of the trench with a trench-fill material (e.g., poly-Si, silicon oxide, silicon nitride, or another suitable trench-fill material). It should be appreciated that, in certain embodiments, the deposition of the sacrificial diffusion source (e.g., in block 122) and/or the subsequent heating of the vertical trench (e.g., in block 124) may be controlled such that there is a gradient in the dopant concentration in the sidewalls of the trench (e.g., having highest dopant concentration near the underlying substrate 24 or having lowest dopant concentration near the underlying substrate 24). As set forth below, with respect to thyristor 130, the doped sidewalls of the etched trench may work in combination with a JTE and/or field stop to electrically terminate the junction 23 of the SiC device 10.

Figure 9:
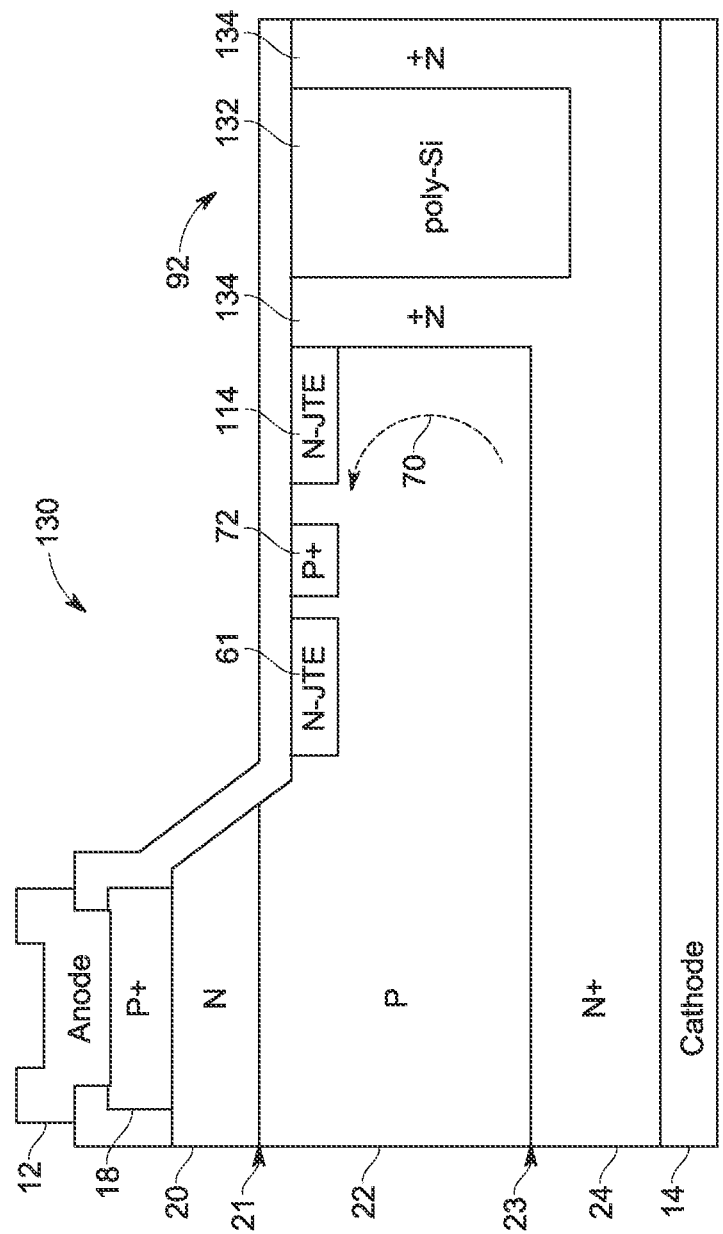
FIG. 9 is a schematic of an embodiment of a fourth thyristor that has been terminated according to the process of FIG. 8.

Turning to FIG. 9, the illustrated thyristor 130 includes many of the features set forth above, with respect to thyristors 60, 90, and 110. For example, the thyristor 130 illustrated in FIG. 9 has a portion of the blocking layer 22 that has been removed to create a trench 92 (e.g., in block 42 of FIG. 8). Further, like thyristor 60 and 90, the thyristor 130 illustrated in FIG. 9 include a poly-Si trench-fill material 132 disposed within the trench 92. However, in contrast to the other thyristors presented, the thyristor 130 illustrated in FIG. 8 includes a trench 92 having substantially n-doped sidewalls 134 (e.g., from blocks 122 and 124 of FIG. 8). During operation, the n-doped sidewalls 134 of the trench 92, the N-JTE 114, and/or the field stop 72 may cooperate to electrically terminate the junction 23 (e.g., the electrical potential 70 induced by the junction 23) of the thyristor 130. That is, the n-doped sidewalls 134 of the trench 92 may generally direct the junction (e.g., the electrical potential 70 induced by the junction 23) toward the surface of the blocking layer 22. Furthermore, upon reaching the N-JTE 114 and/or field stop 72, the strength of the junction (e.g., the electrical potential 70 induced by the junction 23) may be significantly reduced, effectively terminating the junction 23 of the thyristor 130.

Figure 10:
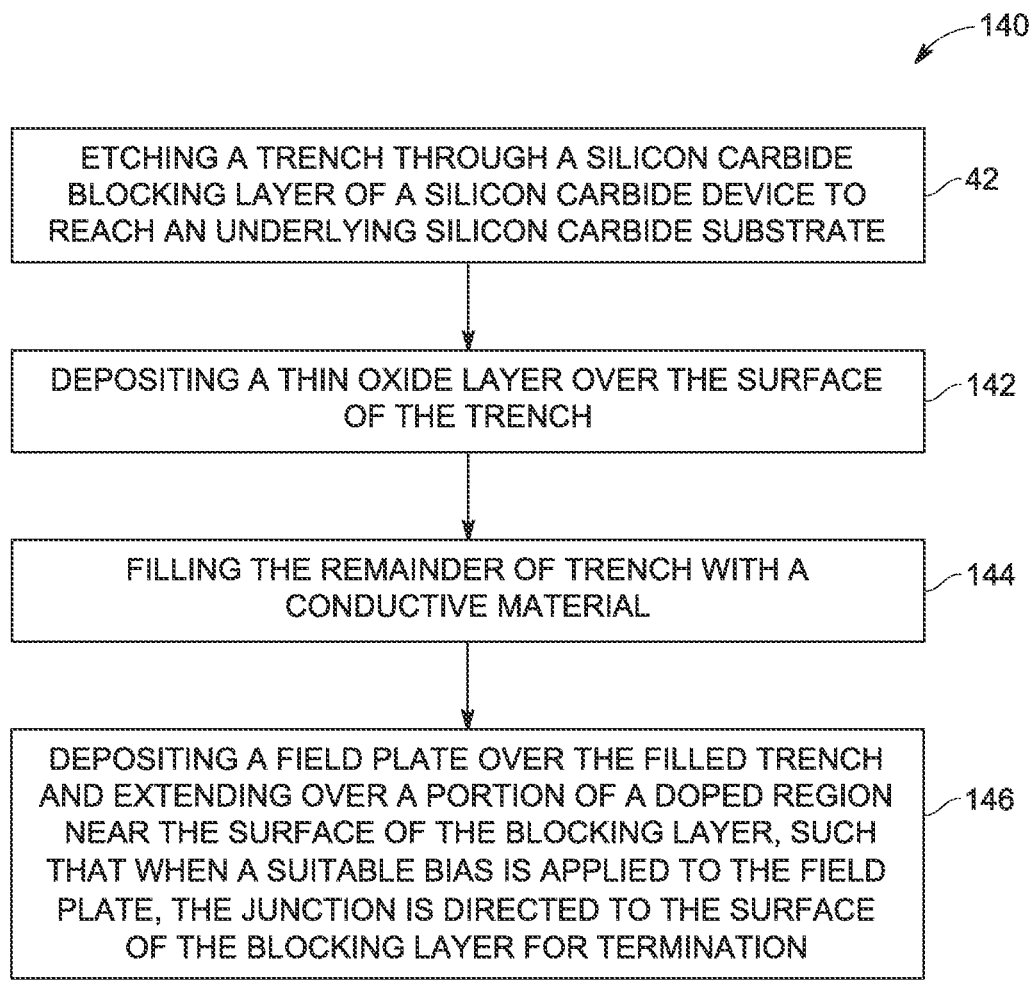
FIG. 10 is a flow diagram illustrating a fifth process by which the SiC device of FIG. 1 may be terminated, in accordance with an embodiment of the present approach.

FIG. 10 illustrates a fifth process 140 for electrically terminating a buried junction of the SiC device 10, in accordance with an embodiment of the present approach. As set forth above, the process 140 illustrated in FIG. 10 may be more clearly understood in the context of the thyristor 150 illustrated in FIG. 11 and discussed in detail below. Like the processes 40, 80, 100, and 120 previously discussed, the process 140 begins with etching (block 42) a trench through a portion of a SiC blocking layer (e.g., blocking layer 22) of a SiC semiconductor device 10 to reach an underlying SiC substrate layer (e.g., substrate layer 24). Subsequently, a thin insulating (e.g., silicon oxide) layer may be deposited (block 142) into the trench in order to electrically isolate the trench produced in block 42. In certain embodiments, the thin insulating layer 152 may have a thickness between approximately 10 nm and approximately 100 μm. The thin insulating layer 152 may be deposited or grown in the vertical trench using standard SiC manufacturing techniques (e.g., lithography, deposition, and/or etching techniques).

The process 140 illustrated in FIG. 10 continues as the remainder of the trench produced in block 42 is filled (block 144) with a conductive material 154, such as doped poly-Si (e.g., n+ poly-Si) or SiC (e.g., n+ SiC), using standard SiC and/or Si manufacturing techniques. Further, on top of this conductive material 154, a field plate (e.g., a metallic field plate) may be deposited (block 146) that is in ohmic contact with the conductive material 154. As discussed below, the field plate (e.g., deposited in block 146) and the conductive material (e.g., deposited in block 144) may work in combination with one or more JTEs, field stops, and/or other features of the SiC device 10 (e.g., features disposed in the blocking layer 22) to electrically terminate the junction 23 of the SiC device 10.

Figure 11:
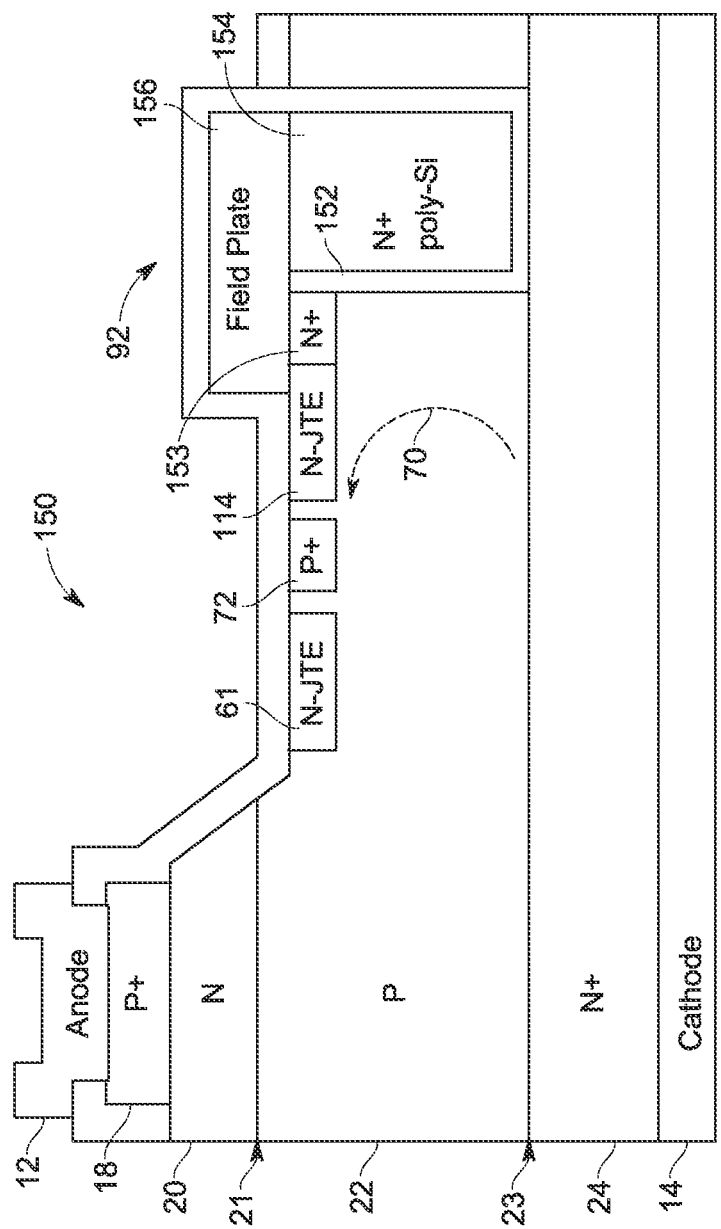
FIG. 11 is a schematic of an embodiment of a fifth thyristor that has been terminated according to the process of FIG. 10.

Turning now to FIG. 11, the illustrated thyristor 150 includes many of the features set forth above, with respect to thyristors 60, 90, 110, and 130. For example, the thyristor 150 illustrated in FIG. 11 has a portion of the blocking layer 22 removed to form a trench 92 having substantially vertical side-walls (e.g., in block 42 of FIG. 11). However, in contrast to other thyristors presented, the thyristor 150 illustrated in FIG. 11 includes a trench 92 having a thin insulating layer 152 (e.g., a silicon oxide layer) lining the walls, separating the contents of the trench 92 from other features (e.g., doped region 153, N-JTE 114, field stop 72, and so forth). Further, the thyristor 150 includes a conductive n-doped poly-Si layer 154 that is disposed within the lined walls of the trench 92. Additionally, a field plate 156 is disposed over the conductive poly-Si layer 154 as well as the doped region 153 at the surface of the blocking layer 22 of the illustrated thyristor 150. The field plate 156 may be electrically coupled to the conductive poly-Si layer 154 as well as the doped region 153 such that a bias applied to the field plate 156 may generate a corresponding electrical potential to be used to terminate the buried junction 23 of the thyristor 150.

Accordingly, during operation of the thyristor 150 illustrated in FIG. 11, a bias may be applied to the field plate 156, which may induce an electrical potential in the electrically coupled poly-Si layer 154 and/or the doped region 153. As such, the electrical potential induced by the applied bias may generally direct the junction (e.g., the electrical potential 70 induced by the junction 23) toward the surface of the blocking layer 22. Furthermore, upon reaching the N-JTE 114 and/or field stop 72, the strength of the junction (e.g., the electrical potential 70 induced by the junction 23) may be significantly reduced, effectively terminating the junction 23 of the thyristor 150.

Technical effects of the present technique include effectively terminating a relatively deeply buried junction (e.g., junction 23 disposed between the blocking layer 22 and the underlying substrate 24) of a wide bandgap semiconductor device (e.g., thyristors 60, 90, 110, 130, and 150). The presently disclosed approach provides a number of different methods for diverting the buried junction (e.g., the electrical field 70 induced by the junction 23 of the SiC device 10) to the surface of the blocking layer (e.g., blocking layer 22 of the device 10) where one or more features (e.g., one or more JTEs and/or field stops) may significantly reduce the strength of the electrical potential, effectively terminating junction 23 of wide bandgap semiconductor device 10.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. An electrical device, comprising:
a blocking layer disposed on top of a substrate layer, wherein the blocking layer and the substrate layer each comprise a wide bandgap semiconductor, and wherein the blocking layer and the substrate layer form a buried junction in the electrical device;
a termination feature disposed at a surface of the blocking layer; and
a filled trench disposed proximate to the termination feature, wherein the filled trench extends through the blocking layer to reach the substrate layer, and wherein the filled trench is configured to direct an electrical potential associated with the buried junction toward the termination feature disposed near the surface of the blocking layer to terminate the buried junction, wherein a sidewall of the filled trench and the blocking layer are oppositely doped and further wherein the sidewall of the filled trench is doped according to a gradient, wherein an amount of dopant present in a portion of the sidewall of the filled trench varies according to a distance from the substrate.

2. The device of claim 1, wherein the wide bandgap semiconductor comprises silicon carbide or gallium nitride.

3. The device of claim 1, wherein the termination feature is configured to terminate the buried junction by substantially reducing the electrical potential associated with the buried junction.

4. The device of claim 1, wherein the termination feature comprises a junction termination extension (JTE) configured to substantially reduce the electrical potential associated with the buried junction to terminate the buried junction.

5. The device of claim 4, wherein the JTE extends vertically along the sidewall of the filled trench.

6. The device of claim 1, wherein the filled trench comprises one or more beveled edges, and wherein the beveled edges of the filled trench are configured to direct the electrical potential associated with the buried junction toward the termination feature to terminate the buried junction.

7. The device of claim 1, wherein the filled trench comprises substantially vertical sidewalls.

8. The device of claim 1, wherein the filled trench includes a non-conductive, trench-fill material comprising polysilicon, silicon oxide, silicon nitride, or a combination thereof.

9. The device of claim 1, wherein the filled trench includes a conductive material comprising doped polysilicon or doped SiC.

10. The device of claim 9, wherein the conductive material is electrically coupled to the substrate layer.

11. The device of claim 9, wherein the conductive material is electrically isolated from the blocking layer and the substrate layer by an insulating layer.

12. The device of claim 11, comprising a field plate disposed over the conductive material, wherein the field plate is configured to receive a bias and to generate an second electrical potential using the bias to direct the electrical potential associated with the buried junction to the termination feature to terminate the buried junction.

13. The device of claim 1, wherein the electrical device comprises a thyristor, an insulated gate bipolar transistor (IGBT), a gate turned-off thyristor (GTO), a bipolar junction transistor (BJT), or any other power device comprising two terminated junctions.

14. A wide bandgap semiconductor device, comprising:
a substrate layer of a first dopant-type;
a blocking layer of a second dopant-type, wherein the blocking layer is disposed on the substrate layer to form a buried junction, and wherein the blocking layer comprises a filled trench and a termination feature that are configured to cooperate to terminate the buried junction, and wherein the termination feature comprises a junction termination extension (JTE), a field stop, or a combination thereof, wherein a sidewall of the filled trench and the blocking layer are oppositely doped and further wherein the sidewall of the filled trench is doped according to a gradient, wherein an amount of dopant present in a portion of the sidewall of the filled trench varies according to a distance from the substrate.

15. The device of claim 14, wherein the substrate layer and the blocking layer each comprise silicon carbide or gallium nitride.

16. The device of claim 14, wherein the first dopant-type is n-doped, and wherein the second dopant-type is p-doped.

17. The device of claim 14, wherein the JTE extends vertically along the sidewall of the filled trench.

18. The device of claim 14, wherein a sidewall of the filled trench has the first dopant-type.

19. The device of claim 14, wherein the filled trench comprises a conductive material electrically coupled to the substrate layer.

20. The device of claim 14, wherein the filled trench comprises a conductive material electrically isolated from the blocking layer, the substrate layer, or both, by an insulating layer.

21. The device of claim 20, wherein the conductive material of the filled trench is configured to terminate the buried junction using a bias received from a field plate electrically coupled to the conductive material.

22. The device of claim 14, wherein the wide bandgap semiconductor device comprises a thyristor, an insulated gate bipolar transistor (IGBT), a gate turned-off thyristor (GTO), a bipolar junction transistor (BJT), or any other power device comprising two terminated junctions.

23. A method for terminating a buried junction of a wide bandgap semiconductor device, comprising:
    providing the wide bandgap semiconductor device comprising a blocking layer disposed on an underlying substrate layer, wherein the blocking layer and the underlying substrate layer form a buried junction in the device;
    forming a field stop, a junction termination extension (JTE), or both, near a surface of the blocking layer; and
    etching a trench through the blocking layer of the wide bandgap semiconductor device to reach the underlying substrate layer, wherein the trench is configured to direct an electrical potential associated with the buried junction toward the surface of the blocking layer, and wherein the field stop, the JTE, or both, are configured to terminate the buried junction by substantially reducing the electrical potential associated with the buried junction,
    depositing a dopant source on a surface of the etched trench and heating the trench such that the dopant source diffuses into one or more sidewalls of the trench,
    wherein the depositing and heating provides a gradient in dopant concentration in the one or more sidewalls of the trench, further wherein sidewalls of the trench and the blocking layer are oppositely doped, and
    further wherein the dopant concentration in a portion of the sidewalls of the trench varies according to a distance from the substrate.

24. The method of claim 23, wherein the underlying substrate layer and the blocking layer each comprise silicon carbide or gallium nitride.

25. The method of claim 23, comprising forming a beveled edge in the trench, wherein the beveled edge of the trench contacts a portion of the blocking layer and a portion of the underlying substrate layer, and wherein the beveled edges of the trench are configured to direct the electrical potential associated with the buried junction toward the surface of the blocking layer.

26. The method of claim 23, comprising forming a vertical JTE in a sidewall of the trench, wherein the vertical JTE is configured to substantially reduce the electrical potential associated with the buried junction.

27. The method of claim 23, comprising depositing an insulating layer onto one or more surfaces of the trench.

28. The method of claim 23, comprising filling the trench with a conductive material electrically coupled to the underlying substrate layer, wherein the conductive material in the trench is capable of directing the electrical potential associated with the buried junction toward the surface of the blocking layer for termination.

29. The method of claim 28, comprising depositing a field plate on the conductive material, wherein the field plate is configured to generate a second electrical potential in the conductive material using an applied bias, and wherein the second electrical potential is configured to direct the electrical potential associated with the buried junction toward the surface of the blocking layer for termination.

30. The method of claim 23, wherein the wide bandgap semiconductor device comprises a thyristor, an insulated gate bipolar transistor (IGBT), a gate turned-off thyristor (GTO), a bipolar junction transistor (BJT), or any other power device comprising two terminated junctions.

* * * * *